(12) United States Patent
Nagaraj et al.

(10) Patent No.: US 8,022,778 B2
(45) Date of Patent: Sep. 20, 2011

(54) LOW PHASE NOISE FREQUENCY SYNTHESIZER

(75) Inventors: Krishnasawamy Nagaraj, Plano, TX (US); Neeraj Nayak, Richardson, TX (US); Srinadh Madhavapeddi, Dallas, TX (US); Baher Haroun, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 88 days.

(21) Appl. No.: 12/577,168

(22) Filed: Oct. 10, 2009

(65) Prior Publication Data

US 2011/0084771 A1   Apr. 14, 2011

(51) Int. Cl.
*H03B 5/12* (2006.01)
(52) U.S. Cl. ............... 331/117 FE; 331/16; 331/179
(58) Field of Classification Search ............ 331/16, 331/17, 34, 117 FE, 117 R, 167, 177 R, 179
See application file for complete search history.

(56) References Cited

U.S. PATENT DOCUMENTS

| 6,271,735 | B1* | 8/2001 | Halamik et al. | 331/111 |
| 6,816,024 | B2* | 11/2004 | Feilkas et al. | 331/182 |
| 7,564,320 | B2* | 7/2009 | Chiu et al. | 331/185 |
| 2003/0146795 | A1* | 8/2003 | Albon et al. | 331/36 C |
| 2008/0164957 | A1* | 7/2008 | Herbert | 331/36 C |
| 2009/0108947 | A1* | 4/2009 | Liu | 331/117 FE |

\* cited by examiner

*Primary Examiner* — Levi Gannon
(74) *Attorney, Agent, or Firm* — John R. Pessetto; W. James Brady; Frederick J. Telecky, Jr.

(57) ABSTRACT

Various apparatuses and methods for a low phase noise frequency synthesizer are disclosed herein. For example, some embodiments provide an oscillator that may be used in a low phase noise frequency synthesizer. The oscillator includes a tank circuit, a plurality of cross-coupled transistor pairs connected to the tank circuit, a current source connected to the plurality of cross-coupled transistor pairs, and at least one switch connected to the plurality of cross-coupled transistor pairs. The switch is adapted to activate a subset of the plurality of cross-coupled transistor pairs and to deactivate another subset of the plurality of cross-coupled transistor pairs to operate the tank circuit in the oscillator using the activated subset of the plurality of cross-coupled transistor pairs.

7 Claims, 5 Drawing Sheets

LOW PHASE NOISE FREQUENCY SYNTHESIZER

BACKGROUND

Electronic circuits often use clock signals to regulate and control their operation. Events in the electronic circuits are timed by rising and/or falling edges of the clock signals. One or more main clock signals are typically provided in an electronic circuit, running at a particular clock speed or frequency. When clock signals having other frequencies are needed in the electronic circuit, they may be generated, for example, by a frequency synthesizer based on the main clock signal.

A typical frequency synthesizer may contain an oscillator such as an LC oscillator, having a tank circuit with an inductor and a capacitor. Energy is alternately transferred between the inductor and capacitor in oscillating fashion. The oscillating energy in the tank circuit is maintained by a current source that is alternately applied in different directions through the tank circuit under the control of cross-coupled transistors which form an effective negative resistance across the tank circuit. The output frequency of the frequency synthesizer is based on the resonant frequency of the tank circuit. It is generally very important that the output frequency be as accurate as possible. Although the output frequency of a frequency synthesizer is constantly corrected and adjusted by a feedback loop, electrical noise in the frequency synthesizer can cause variations in the instantaneous output frequency.

For example, flicker noise in an LC oscillator may adversely affect the oscillator phase noise. Flicker noise is an unwanted variation in the electrical signals in the LC oscillator originating, for example, in the cross-coupled transistors or transistors in the current source. Flicker noise may result from impurities in the gate oxide of MOS transistors, etc. Flicker noise over a large number of transistors has a distribution with a long tail, that is, there is typically a small percentage of the transistors in a group that are several dB worse than the average device. It is therefore not efficient to design a frequency synthesizer around the worst anticipated flicker noise in a particular type of transistor, because the large majority of the transistors in the group are much better than the worst. Flicker noise may also vary randomly with respect to temperature, making it difficult to compensate for flicker noise due to temperature variations in an oscillator during operation.

SUMMARY

Various apparatuses and methods for a low phase noise frequency synthesizer are disclosed herein. For example, some embodiments provide an oscillator that may be used in a low phase noise frequency synthesizer. The oscillator includes a tank circuit, a plurality of cross-coupled transistor pairs connected to the tank circuit, a current source connected to the plurality of cross-coupled transistor pairs, and at least one switch connected to the plurality of cross-coupled transistor pairs. The switch is adapted to activate a subset of the plurality of cross-coupled transistor pairs and to deactivate another subset of the plurality of cross-coupled transistor pairs to operate the tank circuit in the oscillator using the activated subset of the plurality of cross-coupled transistor pairs.

In an embodiment of the oscillator, the at least one switch comprises a switch for each of the cross-coupled transistors in the plurality of cross-coupled transistor pairs, and the switch for each of the cross-coupled transistors is connected between a control input of the transistor and a ground.

An embodiment of the oscillator also includes a shared tail capacitor between the plurality of cross-coupled transistor pairs and the ground.

In an embodiment of the oscillator, the tank circuit comprises an inductor and a capacitor.

In an embodiment of the oscillator, the at least one switch comprises a switch for each of the plurality of cross-coupled transistor pairs, and the switch for each of the plurality of cross-coupled transistor pairs is connected between its associated cross-coupled transistor pair and the current source.

An embodiment of the oscillator also includes a pullup switch between each of the plurality of cross-coupled transistor pairs and a voltage source. A cross-coupled transistor pair is activated when the switch between the cross-coupled transistor pair and the current source is closed and the pullup switch between the cross-coupled transistor pair and the voltage source is open. A cross-coupled transistor pair is deactivated when the switch between the cross-coupled transistor pair and the current source is open and the pullup switch between the cross-coupled transistor pair and the voltage source is closed.

An embodiment of the oscillator also includes a number of tail capacitors, at least one connected between a corresponding one of the plurality of cross-coupled transistor pairs and the ground.

An embodiment of the oscillator also includes a shared tail capacitor connected to the plurality of cross-coupled transistor pairs and the ground.

An embodiment of the oscillator also includes a number of current sinks, each connected between a different one of the plurality of cross-coupled transistor pairs and the ground.

In an embodiment of the oscillator, the current source comprises a bias current input and a current mirror connected to the bias current input. The current mirror comprises a diode-connected transistor connected to the bias current input, and a main transistor connected to the diode-connected transistor and to the plurality of cross-coupled transistor pairs.

In an embodiment of the oscillator, the size of the main transistor is adjustable to control a current level of the current source.

In an embodiment of the oscillator, the diode-connected transistor in the current mirror comprises a plurality of diode-connected primary transistors, each switchably connected to the bias current input.

An embodiment of the oscillator also includes a calibration circuit adapted to measure an output phase noise with each of the plurality of cross-coupled transistor pairs and to select one of the plurality of cross-coupled transistor pairs producing a lowest output phase noise.

In an embodiment of the oscillator, the calibration circuit comprises a counter and a delay locked loop. The delay locked loop is adapted to improve the resolution of the counter.

Other embodiments include a method of providing a clock signal. One of a plurality of cross-coupled transistor pairs connected to a tank circuit in an oscillator is selected. An electrical current through the selected cross-coupled transistor pair is provided. An electrical charge in the tank circuit is controlled using the selected cross-coupled transistor pair to direct the electrical current in order to produce an oscillating clock signal at an output of the tank circuit.

An embodiment of the method also includes measuring a phase noise of the oscillator.

In an embodiment of the method, the phase noise measurement includes counting the number of oscillator output cycles during a fixed time interval, and comparing a count result with an expected count to determine the phase noise.

Other embodiments provide a frequency synthesizer. The frequency synthesizer comprises a clock input, a frequency comparator connected to the clock input, an integrator connected to the frequency comparator, and a digitally controlled oscillator connected to the integrator. The oscillator includes a tank circuit having an inductor and a capacitor. The oscillator also includes a number of cross-coupled transistor pairs connected to the tank circuit, each comprising a pair of cross-coupled transistors. The oscillator also includes a current source connected to the cross-coupled transistor pairs. The current source comprises a bias current input and a current mirror connected to the bias current input. The current mirror includes a number of diode connected primary transistors, each switchably connected to the bias current input, and a secondary transistor connected to the diode connected primary transistors and to the cross-coupled transistor pairs. The size of the secondary transistor is adjustable to control a current level of the current source. The oscillator also includes a number of switches, at least one for each of the cross-coupled transistor pairs. The switches are adapted to activate a subset of the cross-coupled transistor pairs and to deactivate another subset of the cross-coupled transistor pairs to operate the tank circuit in the oscillator using the activated subset of cross-coupled transistor pairs. The oscillator also includes a calibration circuit adapted to measure an output phase noise with each of the tank circuit detectors and to select one of the tank circuit detectors producing a lowest output phase noise. The calibration circuit includes a counter and a delay locked loop. The delay locked loop is adapted to improve the resolution of the counter.

This summary provides only a general outline of some particular embodiments. Many other objects, features, advantages and other embodiments will become more fully apparent from the following detailed description, the appended claims and the accompanying drawings.

BRIEF DESCRIPTION OF THE DRAWINGS

A further understanding of the various embodiments may be realized by reference to the figures which are described in remaining portions of the specification. In the figures, like reference numerals may be used throughout several drawings to refer to similar components.

DESCRIPTION

The drawings and description, in general, disclose various embodiments of a low phase noise frequency synthesizer or an oscillator that may be used in a low phase noise frequency synthesizer. Various apparatuses and methods are disclosed to reduce flicker noise from one or more sources in the oscillator. For example, the oscillator in one embodiment may comprise a digitally controlled oscillator for use in the frequency synthesizer of a frequency modulated (FM) receiver. Phase noise is reduced in the output of the frequency synthesizer by reducing the flicker noise in the oscillator used in the synthesizer.

Figure 1:
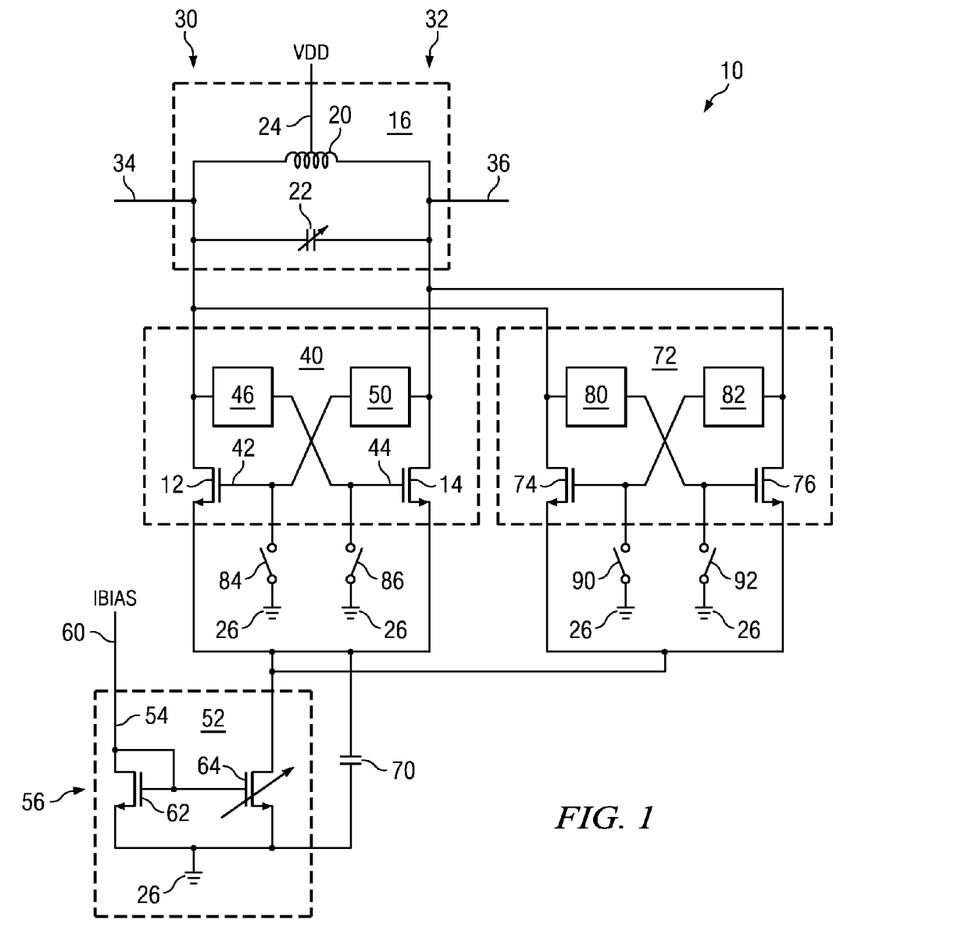
FIG. 1 depicts an LC oscillator core having multiple cross-coupled transistor pairs, shared bias current, shared tail capacitor and switchably grounded cross-coupled transistor gates in accordance with some embodiments.

Referring to FIG. 1, an embodiment of an LC oscillator core 10 is illustrated in which flicker noise from cross-coupled transistors (e.g., 12 and 14) is reduced. Before describing the apparatuses and methods used to reduce flicker noise and therefore phase noise in more detail, an example of a LC oscillator core 10 which may benefit from reduced flicker noise will be described. The LC oscillator core 10 includes a tank circuit 16 to store a time-varying, oscillating electrical charge that can be used as a clock source. The electrical charge on the capacitor 22 oscillates between two opposite states. For example, if the left side 30 of the capacitor 22 has a higher charge than the right side 32, a current will flow from the left side 30 to the right 32 through the inductor 20. This current through the inductor 20 generates a magnetic field in the inductor 20. When the capacitor 22 is discharged and the left and right sides 30 and 32 are at about equal voltage potentials, the magnetic field in the inductor 20 will begin to collapse, maintaining the current flowing from left 30 to right 32 through the inductor 20 until the magnetic field is depleted, at which point the right side 32 of the capacitor 22 will be charged higher than the left 30. The current flow then reverses, flowing from the right side 32 of the capacitor 22 to the left side 30 through the inductor 20. This process continues, with the higher voltage potential alternating between the left and right sides 30 and 32 of the tank circuit 16. The output of the tank circuit 16 may be taken as a single-ended output 34 or 36 from either the left or right sides 30 or 32, or as a differential output 34 and 36 from both sides 30 and 32.

Because some energy is lost in the tank circuit 16 during operation, the tank circuit 16 is connected to a voltage supply VDD 24 to provide energy to the inductor 20 and capacitor 22. The tank circuit 16 is also connected to ground 26 through two paths through the cross-coupled transistors 12 and 14 to alternately pull one side 30 and then the other 32 of the tank circuit 16 down to ground 26. The cross-coupled transistors 12 and 14 form a cross-coupled transistor pair 40 that helps to keep the tank circuit 16 oscillating. The cross-coupled transistors 12 and 14 switch automatically based on the oscillating charge in the tank circuit 16. When the left side 30 of the tank circuit 16 is at a higher voltage potential than the right side 32, the gate 42 of the left cross-coupled transistor 12 will be at a low voltage, turning off or opening the left cross-coupled transistor 12. The gate 44 of the right cross-coupled transistor 12 will be at a high voltage, turning on or closing the right cross-coupled transistor 12 and pulling the right side 32 of the tank circuit 16 down toward ground 26. As the right side 32 of the capacitor 22 is charged by the current flowing from left 30 to right 32 through the inductor 20, the voltage rises on the right side 32 and drops on the left side 30 of the tank circuit 16. When the voltage at the gate 44 of the right cross-coupled transistor 14 falls below the threshold voltage of the transistor 14, the cross-coupled transistor 14 will turn off. At about the same time, the voltage at the gate 42 of the left cross-coupled transistor 12 will rise above the threshold voltage of the transistor 12 and the cross-coupled transistor 12 will turn on. This pulls down the left side 30 of the tank circuit 16 toward ground and allows the right side 32 to rise up near VDD 24. The operating points of the cross-coupled transistors can be de-coupled from the tank circuit by using RC coupling networks 46 and 50.

The frequency of the LC oscillator core 10 is based at least in part on the inductance and capacitance of the tank circuit 16 and on the current level through the cross-coupled transistor pair 40. Although the LC oscillator core 10 may be adapted to provide the desired frequency in any suitable manner, the example LC oscillator core 10 illustrated in FIG. 1 includes a fixed value center-tapped inductor 20, or two fixed value inductors connected at a common end to VDD 24 and at opposite ends to the outputs 34 and 36 of the tank circuit 16. The example LC oscillator core 10 also includes a variable capacitor 22 that may be implemented using an electronically or mechanically variable capacitance, such as with a bank of switchable capacitors or a varactor. The current level through the cross-coupled transistor pair 40 is established by a current source 52 connected in series with the tank circuit 16 and cross-coupled transistor pair 40 between VDD 24 and ground 26. Although the LC oscillator core 10 is not limited to any particular type of current source 52, the example embodiment illustrated in FIG. 1 includes a bias current input 54 and a current mirror 56. A bias current source IBIAS 60 is connected to the bias current input 54 and may provide a constant current level during operation or may be varied as desired.

The current mirror 56 mirrors the current from the bias current source 60 (or a proportional current level) to the tank circuit 16 and cross-coupled transistor pair 40. The current mirror 56 may include a diode-connected transistor 62 having a common drain and gate connected to the bias current input 54, and a source connected to the ground 26. (Note that although the example embodiments disclosed herein are based upon N-channel metal-oxide-semiconductor field-effect transistors (MOSFETS), the reduced flicker noise oscillator and low phase noise frequency synthesizer may be adapted to use any suitable transistor or other devices desired.) The current mirror 56 also includes a main transistor 64 having a gate connected to the common drain and gate of the diode-connected transistor 62, a source connected to ground 26 and a drain connected to the sources of the cross-coupled transistors 12 and 14. The main transistor 64 in the current mirror 56 may have a variable size if desired to set the current level through the tank circuit 16 and cross-coupled transistor pair 40 without adjusting the bias current source 60. By changing the size of the main transistor 64 relative to that of the diode-connected transistor 62, the ratio of the current through the main transistor 64 to that through the diode-connected transistor 62 may be varied. For example, if the main transistor 64 includes 16 transistors connected in parallel, each having the same size as the diode-connected transistor 62, each of the 16 transistors may be individually turned on. This enables the selection of 16 different current ratios, ranging from 1:1 to 16:1.

The LC oscillator core 10 may also include a tail capacitor 70 connected in parallel with the tail current source 52 between the ground 26 and the sources of the cross-coupled transistors 12 and 14. The tail capacitor 70 helps improve the phase noise by providing an alternate current path for the tail current through the main transistor 64 of the current mirror 56, away from the cross-coupled transistor pair 40, during certain intervals of every cycle. The current source 52 drives the tail current through the cross-coupled transistors 12 or 14 during peak waveform periods when the tank circuit 16 is most highly differentially charged, but during zero-crossings of the tank circuit 16, the tail capacitor 70 steals tail current and reduces the drain current and drain current noise through the cross-coupled transistors 12 and 14.

Having described an example of the LC oscillator core 10, the apparatuses and methods used to reduce flicker noise and therefore phase noise will be described in more detail. Sources of flicker noise are identified in the LC oscillator core 10, and redundant selectable components are provided for those potential flicker noise sources. During configuration and/or during operation, the noise resulting from the redundant selectable components is measured and the best is chosen and used.

In the embodiment of FIG. 1, flicker noise is reduced by including one or more redundant cross-coupled transistor pairs 72. In this embodiment, the redundant cross-coupled transistor pair 72 is a replica of the first cross-coupled transistor pair 40, including transistors 74 and 76 and RC coupling networks 80 and 82. The drains of the transistors 74 and 76 in the redundant cross-coupled transistor pair 72 are connected to the drains of the transistors 12 and 14 in the cross-coupled transistor pair 40 and to the outputs 34 and 36 of the tank circuit 16. The sources of the cross-coupled transistors 74 and 76 are connected to the sources of the cross-coupled transistors 12 and 14 and to the current source 52, and to the tail capacitor 70. The cross-coupled transistor pair 40 and redundant cross-coupled transistor pair 72 are each enabled in turn and the noise is measured with each. This noise measurement may be performed during manufacturing, during power-on configuration, during operation, or in a combination, and may be performed once or repeatedly as desired. The cross-coupled transistor pair 40 or 72 generating the least noise is selected and enabled for use in the LC oscillator core 10.

In the embodiment illustrated in FIG. 1, the cross-coupled transistor pairs 40 and 72 are disabled by grounding the gates of the cross-coupled transistors 12, 14, 74 and 76. For example, to enable the cross-coupled transistor pair 40 and disable the redundant cross-coupled transistor pair 72, the gates of the transistors 12 and 14 in the cross-coupled transistor pair 40 are ungrounded and the gates of the transistors 74 and 76 in the redundant cross-coupled transistor pair 72 are grounded. The transistors 74 and 76 in the redundant cross-coupled transistor pair 72 are therefore prevented from turning on in response to voltages at the outputs 34 and 36 of the tank circuit 16. If the cross-coupled transistor pair 40 is noisier than the redundant cross-coupled transistor pair 72, the cross-coupled transistor pair 40 is disabled by grounding the gates of the transistors 12 and 14 and the redundant cross-coupled transistor pair 72 is enabled by un-grounding the gates of the transistors 74 and 76. The gates of the transistors 12, 14, 74 and 76 may be grounded by any suitable device, such as using MOSFET switches 84, 86, 90 and 92. The MOSFET switches 84, 86, 90 and 92 may be controlled with any suitable device, such as using a memory or state machine, or an eFuse, a programmable electrical fuse fabricated on an integrated circuit.

The LC oscillator core 10 embodiment of FIG. 1 provides multiple selectable cross-coupled transistor pairs 40 and 72 having a shared bias tail current and tail capacitor, controlled by switchably grounded cross-coupled transistor gates. This allows the LC oscillator core 10 to be designed based on average or typical transistor noise characteristics, rather than trying to provide a design that operates normally with the most noisy transistors. If one of the cross-coupled transistor pairs 40 or 72 has particularly noisy transistors, it can be disabled and an alternate cross-coupled transistor pair substituted in its place. Although only two cross-coupled transistor pairs 40 and 72 are illustrated in this and other embodiments discussed herein, the LC oscillator core 10 may include more than two if desired.

Figure 2:
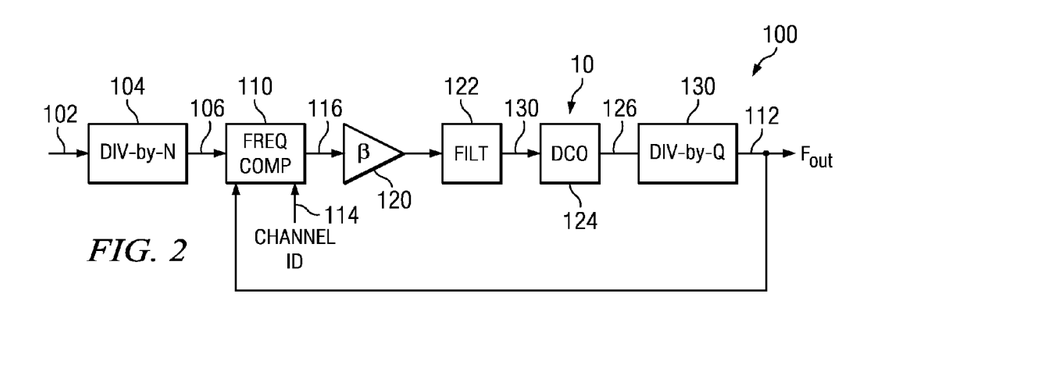
FIG. 2 depicts a frequency synthesizer in accordance with some embodiments.

Referring now to FIG. 2, an example of a frequency synthesizer 100 that may use the LC oscillator core 10 is illustrated. The frequency synthesizer 100 may be used for example to provide a tunable reference clock in an FM receiver that is mixed with the RF (radio frequency) signal from an antenna. An input clock 102 from a crystal or other source is divided down to generate an internal reference clock 106 in a divider 104. A frequency comparator 110 counts the number of cycles or transitions in the output 112 of the frequency synthesizer 100 during a cycle or other interval of the reference clock 106 to determine whether the output 112 is at the correct frequency relative to the input clock 102. A Channel ID input 114 to the frequency comparator 110 sets the FM channel by identifying the number of cycles at the output 112 that should take place during a reference clock 106 interval. An error signal 116 is generated by the frequency comparator 110 and is scaled by a loop gain element 120, which provides an adjustable gain so that the loop is stable and the desired frequency resolution is achieved. The error signal is filtered by a digital loop filter 122. A digitally controlled oscillator 124 based on the LC oscillator core 10 of FIG. 1 generates a clock signal 126, with the frequency of the clock signal 126 controlled by the accumulated and amplified error signal 130. The accumulated and amplified error signal 130 may be used to control the capacitance of the tank circuit capacitor 22, the size of the main transistor 64 in the tail current source 52, or in any other suitable way to control the frequency of the clock signal 126 at the output 34 and 36 of the LC oscillator core 10. The frequency of the clock signal 126 from the digitally controlled oscillator 124 may be divided in a divider 130 to provide the desired output clock 112. Again, the apparatuses and methods for reducing flicker noise from one or more sources in an oscillator are not limited to use with any particular oscillator or frequency synthesizer, and the frequency comparator 110 is an example. By reducing the flicker noise in the LC oscillator core 10, phase noise in the output 112 of the frequency synthesizer 100 can be reduced.

Figure 3:
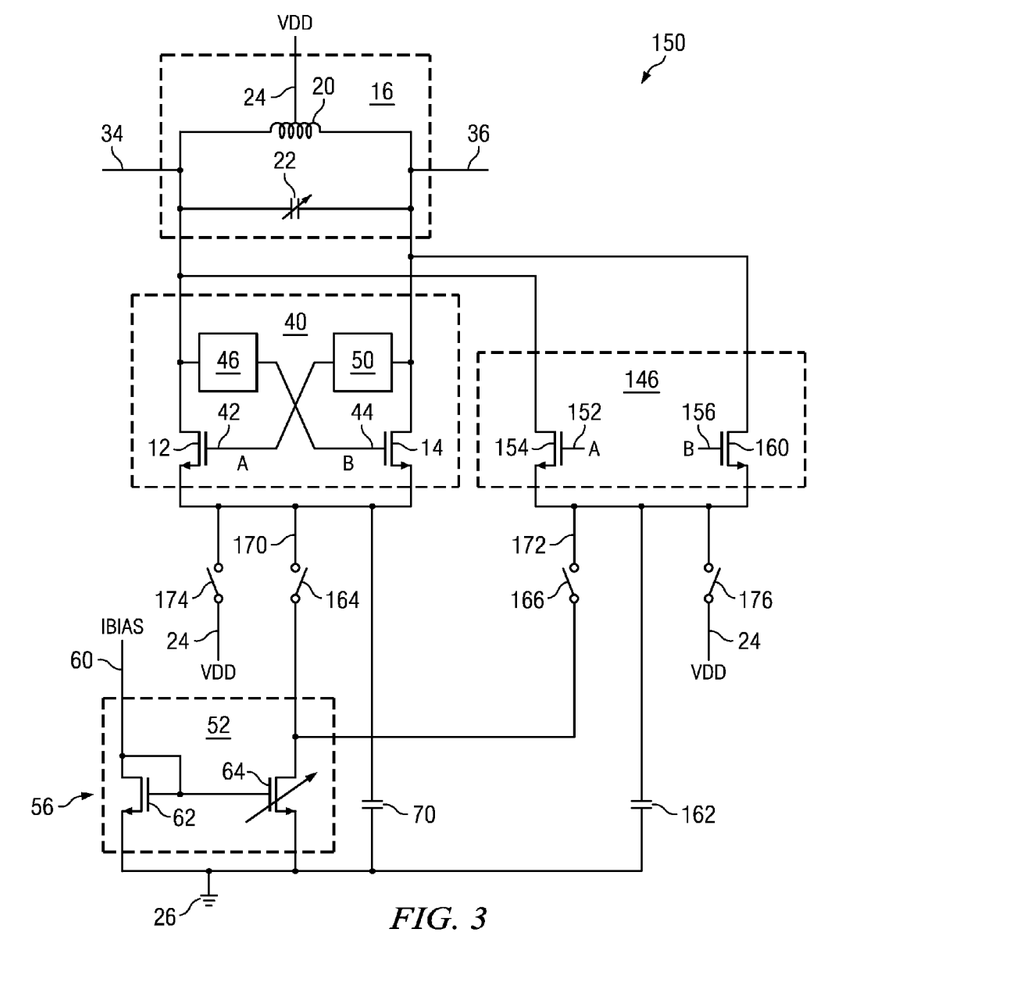
FIG. 3 depicts an LC oscillator core having multiple cross-coupled transistor pairs, switchably connected bias current, shared coupling network and independent tail capacitors in accordance with some embodiments.

Referring now to FIG. 3, the cross-coupled transistor pairs 40 and 146 in an LC oscillator core 150 may share RC coupling networks 46 and 50. In this embodiment, the gates 42 and 152 of the left transistors 12 and 154 in the cross-coupled transistor pairs 40 and 146 are connected, and the gates 44 and 156 of the right transistors 14 and 160 are connected. (These connections are denoted in FIG. 3 by letters A and B to simplify the illustration.) Each of the cross-coupled transistor pairs 40 and 146 has its own dedicated tail capacitor 70 and 162, respectively. In this embodiment, the cross-coupled transistor pairs 40 and 146 are enabled and disabled by connecting and disconnecting the tail current source 52 using switches 164 and 166. For example, to enable the cross-coupled transistor pair 40, the switch 164 is closed, connecting the drain of the main transistor 64 in the current mirror 56 to the sources of the transistors 12 and 14. To disable the cross-coupled transistor pair 40, the switch 164 is opened. Similarly, to enable the redundant cross-coupled transistor pair 146, the switch 166 is closed, connecting the drain of the main transistor 64 in the current mirror 56 to the sources of the transistors 154 and 156. To disable the cross-coupled transistor pair 146, the switch 166 is opened. As with the previous embodiment, one of the cross-coupled transistor pairs 40 and 146 is enabled and the other is disabled, based on which of the two generates more flicker noise.

The tail current connections 170 and 172 at the sources of the transistors 12, 14, 154 and 160 in the cross-coupled transistor pairs 40 and 146 may be connected to VDD 24 through switches 174 and 176, respectively, to pull up the tail current connection 170 or 172 when the associated cross-coupled transistor pairs 40 or 146 is disabled. For example, if switch 164 is closed, switch 174 is opened and vice versa. If switch 166 is closed, switch 176 is opened and vice versa. By pulling up the sources of the transistors 12, 14, 154 and 160 when one of the cross-coupled transistor pairs 40 or 146 is disabled, the sources are prevented from floating down to a voltage level that would turn on the MOSFET parasitic diodes to the substrate and cause current leakage.

Figure 4:
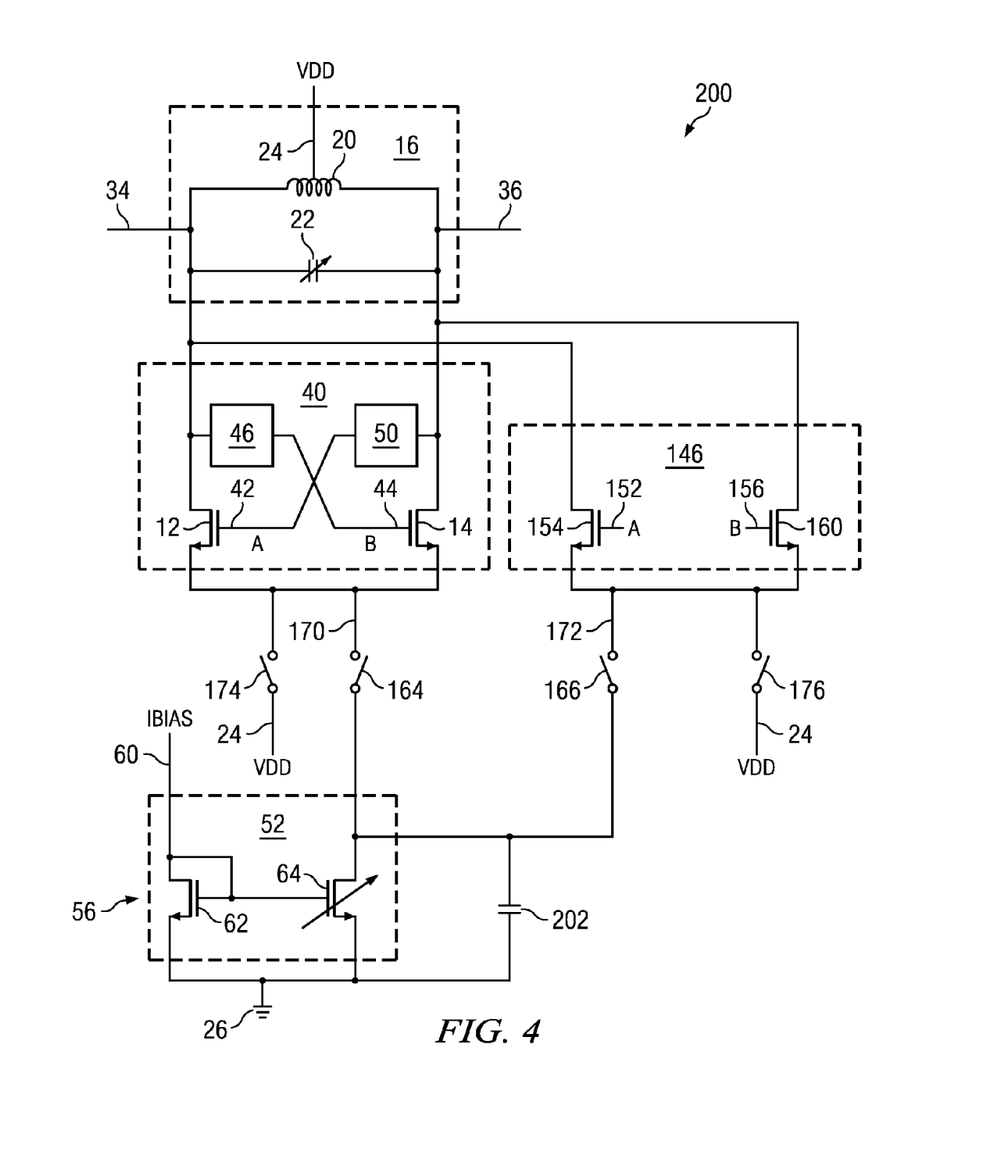
FIG. 4 depicts an LC oscillator core having multiple cross-coupled transistor pairs, switchably connected bias current, a shared tail capacitor and switchable cross-coupled transistor gate pullups in accordance with some embodiments.

Referring now to FIG. 4, the cross-coupled transistor pairs 40 and 146 in an LC oscillator core 200 may share a tail capacitor 202 that is connected in parallel with the main transistor 64 in the current mirror 56. The resistance of the switch 164 should be low enough to avoid introducing any unwanted time constants in the tail current based at least in part on the resistance of the switch 164 and the capacitance of the tail capacitor 202.

Figure 5:
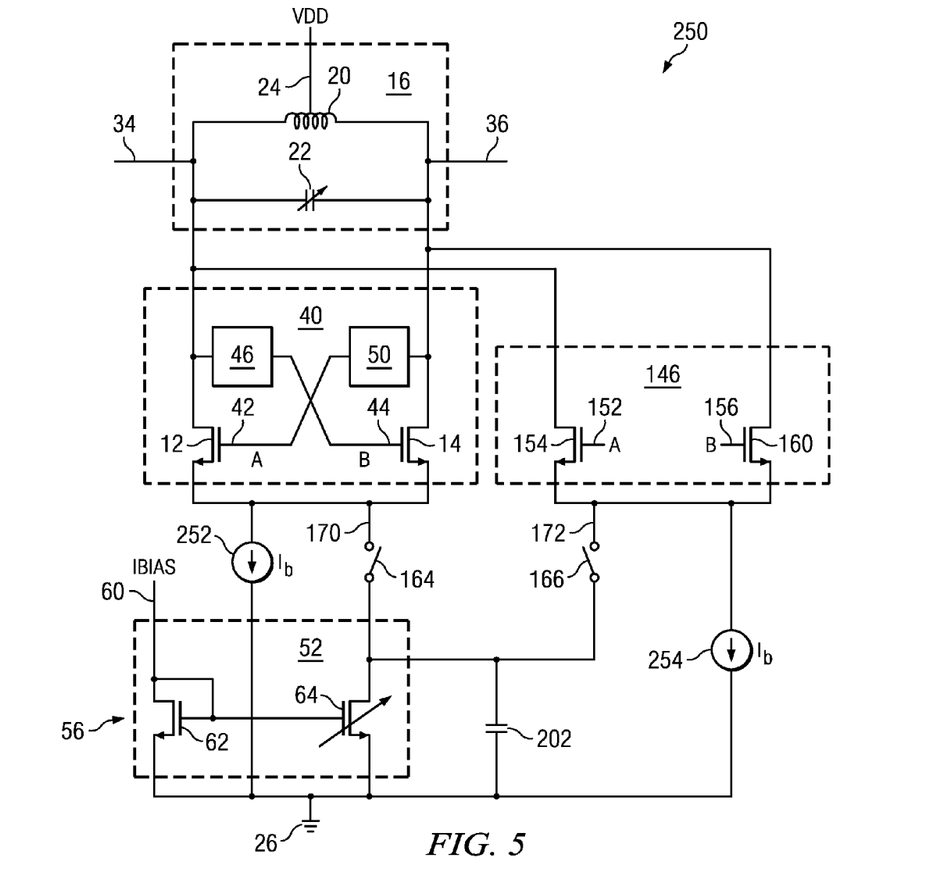
FIG. 5 depicts an LC oscillator core having multiple cross-coupled transistor pairs, switchably connected bias current, a shared tail capacitor and cross-coupled transistor current sinks in accordance with some embodiments.

Referring now to FIG. 5, current leakage due to parasitic diodes in the cross-coupled transistors 12, 14, 154 and 160 of an LC oscillator core 250 may be prevented using current sources 252 and 254 connected between the tail current connections 170 and 172 and ground 26. For example, small transistors can be used to create a relatively small current through the cross-coupled transistors 12, 14, 154 and 160 to keep parasitic diodes off in inactive transistors. With a small enough relative current through the current sources 252 and 254 it can be left on for both active and inactive cross-coupled transistor pairs 40 and 146. For example, the current sources 252 and 254 may generate a current on the order of a microamp, in comparison with a tail current on the order of a milliamp.

Another source of flicker noise in an LC oscillator core 300 is in the tail current source 302, and particularly in the relatively small diode-connected transistor (e.g., 62). In the embodiment illustrated in FIG. 6, the current mirror 304 includes at least one redundant diode-connected transistor 306 connected in parallel with the diode-connected transistor 62. As with the cross-coupled transistor pairs 40 and 146, each of the diode-connected transistors 62 and 306 is enabled in turn and the resulting noise is measured. The diode-connected transistor 62 or 306 causing the least noise can then be left enabled during operation. The noise measurement may be performed once or multiple times, at any suitable time, such as during manufacturing, during power-on tests, or during operation, etc. The diode-connected transistors 62 and 306 may be enabled and disabled by switches 310 and 312, controlled by eFuses or other devices as discussed above. As with the cross-coupled transistor pairs 40 and 146, the current mirror 304 is not limited to the two diode-connected transistors 62 and 306 illustrated in FIG. 6.

Figure 6:
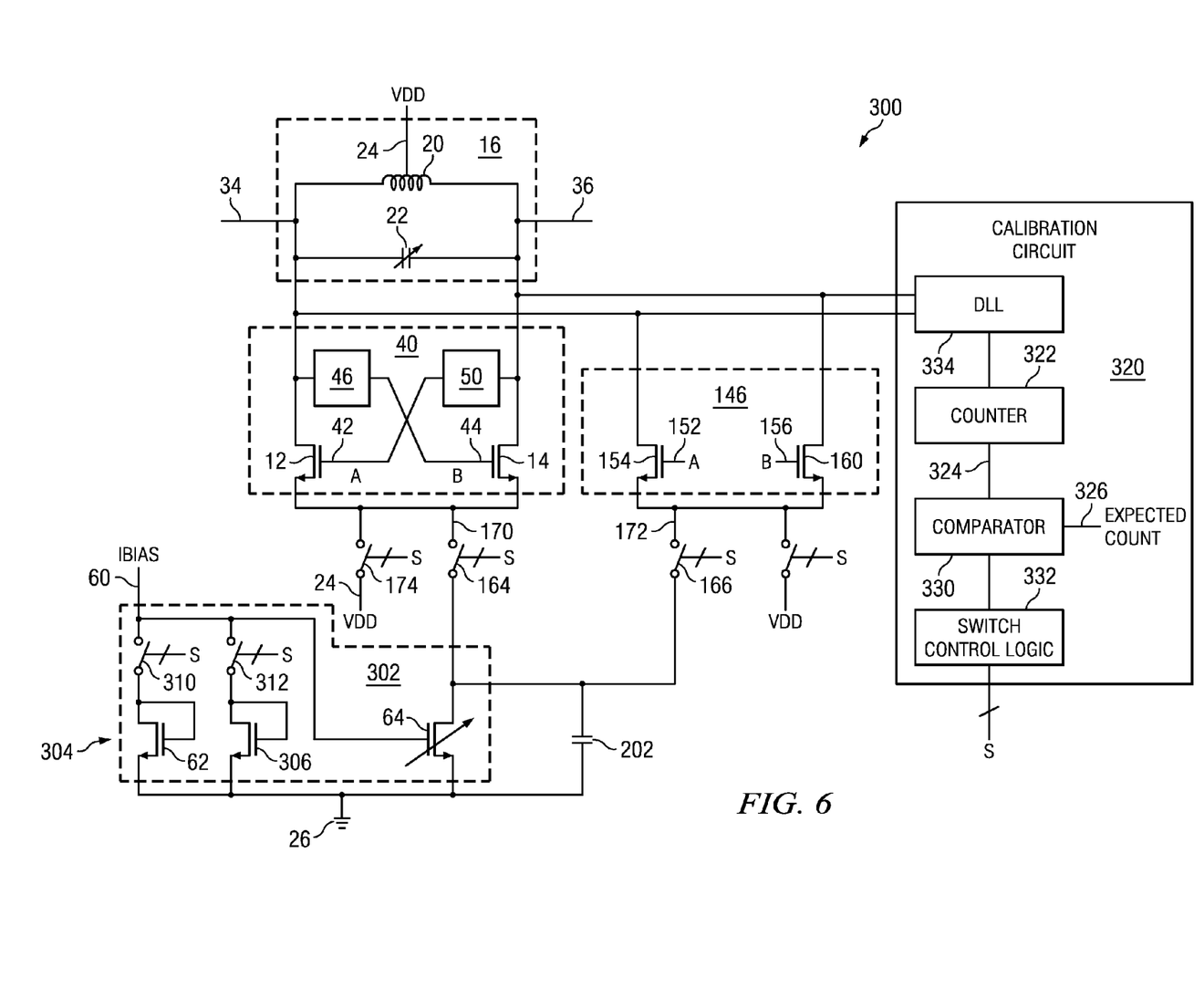
FIG. 6 depicts an LC oscillator core having multiple cross-coupled transistor pairs, switchably connected bias current, a shared tail capacitor, switchable cross-coupled transistor gate pullups, selectable bias current source diodes and a calibration circuit in accordance with some embodiments.

The transistors generating the least flicker noise, whether in a cross-coupled transistor pair (e.g., 40) or a current source (e.g., 52), may be identified by measuring the phase noise at the output 112 of a frequency synthesizer 100 while switching between redundant components. For example, an on-chip calibration circuit 320 may be used to measure the phase noise at the output while alternately selecting each redundant cross-coupled transistor pair (e.g., 40) and/or current source (e.g., 52), then continuing to use the least noisy configuration. In another example, the transistors generating the least flicker noise may be identified during manufacturing by measuring the signal-to-noise ratio (SNR) of the LC oscillator core 10 or the frequency synthesizer 100 with each of the redundant components, then setting eFuses to select the least noisy components. The SNR measurements may be repeated at different temperatures to account for the affects of temperature variations when selecting the least noisy components.

An example of a method for measuring the phase noise at the output 34 and 36 of an LC oscillator core 10 includes counting the clock cycles or transitions over a fixed time interval established by the reference clock 106 using a counter 322 in the calibration circuit 320. The measurement interval can be used to control the offset frequency range of the phase noise being measured. For example, a 10 ms window would account for offset frequencies above 100 Hz. During each interval, the error between the accumulated count 324 and the expected count 326 is determined by a comparator 330. The measurement may be performed over several intervals and the mean squared sum of the errors calculated. This measurement process is repeated for each redundant component, such as each cross-coupled transistor pair (e.g., 40) and each diode-connected transistor (e.g., 62). Switch control logic 332 then selects the least noisy components based on the measurements.

To accurately identify the least noisy components, both edges of the output 34 and 36 of the LC oscillator core 10 may be counted to provide the best possible resolution. Further improvement of the resolution may be obtained by using a delay locked loop (DLL) 334 to resolve the clock intervals at the output 34 and 36 of the LC oscillator core 10 into smaller fractions. For example, an eight-stage DLL provides a four-fold improvement over just counting both edges of the output 34 and 36 of the LC oscillator core 10.

Figure 7:
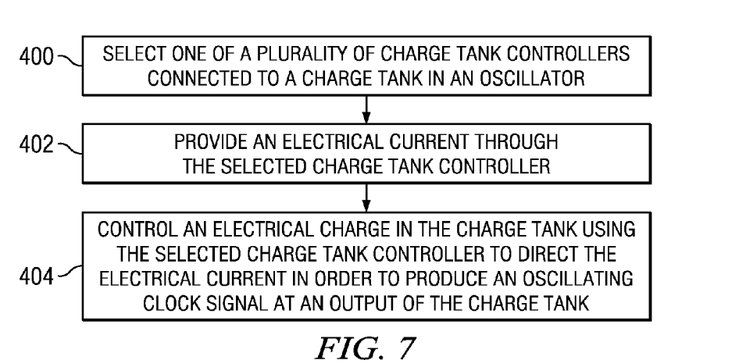
FIG. 7 is a flow chart of method of providing a clock signal in accordance with some embodiments.

The LC oscillator cores (e.g., 10) and their variations described above may be used to provide a clock signal by selecting one of a plurality of cross-coupled transistor pairs connected to a tank circuit in an oscillator (block 400, FIG. 7), providing an electrical current through the selected cross-coupled transistor pair (block 402), and controlling an electrical charge in the tank circuit using the selected cross-coupled transistor pair to direct the electrical current in order to produce an oscillating clock signal at an output of the tank circuit. (Block 404) The methods and apparatuses disclosed herein enable systems that are tolerant to flicker noise by selecting the best of multiple redundant components, thereby eliminating the need for extremely noise-tolerant designs.

Various embodiments may select and enable only one cross-coupled transistor pair 40 and one diode-connected transistor 62, or may select multiple redundant devices simultaneously if desired. The terms activating and deactivating or enabling and disabling as used herein may refer to any suitable means for using or not using a particular component, including connecting and disconnecting, powering or un-powering, etc. Redundant cross-coupled transistor pairs (e.g., 40 and 72) and diode-connected transistors (e.g., 62 and 306) can be identical, switched only to select the set that contributes the lowest flicker noise. In other embodiments, redundant components may be different if desired to meet any particular requirements in addition to reducing noise, such as changing switching time constants or tail current levels.

While illustrative embodiments have been described in detail herein, it is to be understood that the concepts disclosed herein may be otherwise variously embodied and employed.

What is claimed is:

1. An oscillator comprising:
   a tank circuit;
   a plurality of cross-coupled transistor pairs connected to the tank circuit;
   a current source connected to the plurality of cross-coupled transistor pairs;
   at least one switch connected to the plurality of cross-coupled transistor pairs, wherein the switch is adapted to activate a subset of the plurality of cross-coupled transistor pairs and to deactivate another subset of the plurality of cross-coupled transistor pairs to operate the tank circuit in the oscillator using the activated subset of the plurality of cross-coupled transistor pairs;
   wherein the current source comprises:
   a bias current input; and
   a current mirror connected to the bias current input, the current mirror comprising a diode-connected transistor connected to the bias current input, and a main transistor connected to the diode-connected transistor and to the plurality of cross-coupled transistor pairs;
   wherein the diode-connected transistor in the current mirror comprises a plurality of diode-connected transistors, each switchably connected to the bias current input.

2. The oscillator of claim 1, further comprising a calibration circuit adapted to measure an output phase noise with each of the plurality of cross-coupled transistor pairs and to select one of the plurality of cross-coupled transistor pairs producing a lowest output phase noise.

3. The oscillator of claim 2, the calibration circuit comprising a counter and a delay locked loop, wherein the delay locked loop is adapted to improve a resolution of the counter.

4. A method of providing a clock signal, the method comprising:
   selecting one of a plurality of cross-coupled transistor pairs connected to a tank circuit in an oscillator;
   providing an electrical current through the selected cross-coupled transistor pair; and
   controlling an electrical charge in the tank circuit using the selected cross-coupled transistor pair to direct the electrical current in order to produce an oscillating clock signal at an output of the tank circuit;
   measuring a phase noise of the oscillator;
   wherein said measuring the phase noise comprises:
   counting a number of oscillator output cycles during a fixed time interval; and
   comparing a count result with an expected count to determine the phase noise.

5. The method of claim 4, wherein said measuring the phase noise further comprises improving a resolution of the oscillator output cycles in a delay locked loop.

6. The method of claim 4, wherein said measuring is performed repeatedly and a mean squared sum of the count result is calculated.

7. A frequency synthesizer comprising:
   a clock input;
   a frequency comparator connected to the clock input;
   an integrator connected to the frequency comparator;
   a digitally controlled oscillator connected to the integrator, the oscillator comprising:
   a tank circuit comprising an inductor and a capacitor;
   a plurality of cross-coupled transistor pairs connected to the tank circuit, each comprising a pair of cross-coupled transistors;
   a current source connected to the plurality of cross-coupled transistor pairs, the current source comprising:
   a bias current input; and
   a current mirror connected to the bias current input, the current mirror comprising a plurality of diode-connected transistors, each switchably connected to the bias current input, and a main transistor connected to the plurality of diode-connected transistors and to the plurality of cross-coupled transistor pairs, wherein a size of the main transistor is adjustable to control a current level of the current source;

a plurality of switches, at least one for each of the plurality of cross coupled transistor pairs, wherein the plurality of switches are adapted to activate a subset of the plurality of cross-coupled transistor pairs and to deactivate another subset of the plurality of cross-coupled transistor pairs to operate the tank circuit in the oscillator using the activated subset of the plurality of cross-coupled transistor pairs; and a calibration circuit adapted to measure an output phase noise with each of the plurality of tank circuit detectors and to select one of the tank circuit detectors producing a lowest output phase noise, the calibration circuit comprising a counter and a delay locked loop, wherein the delay locked loop is adapted to improve a resolution of the counter.

* * * * *